United States Patent
Huh et al.

(10) Patent No.: US 11,507,801 B2
(45) Date of Patent: Nov. 22, 2022

(54) METHOD FOR DETECTING DEFECTS IN SEMICONDUCTOR DEVICE

(71) Applicant: SAMSUNG ELECTRONICS CO., LTD., Suwon-si (KR)

(72) Inventors: In Huh, Seoul (KR); Min Chul Park, Hwaseong-si (KR); Tae Ho Lee, Suwon-si (KR); Chang Wook Jeong, Hwaseong-si (KR); Chan Young Hwang, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 780 days.

(21) Appl. No.: 16/505,155

(22) Filed: Jul. 8, 2019

(65) Prior Publication Data
US 2020/0034693 A1  Jan. 30, 2020

(30) Foreign Application Priority Data
Jul. 27, 2018 (KR) .......................... 10-2018-0087488

(51) Int. Cl.
*G06N 3/04* (2006.01)
*G06N 3/08* (2006.01)
*G06F 30/30* (2020.01)

(52) U.S. Cl.
CPC ........... *G06N 3/0454* (2013.01); *G06F 30/30* (2020.01); *G06N 3/08* (2013.01)

(58) Field of Classification Search
CPC ...... G06N 3/0454; G06N 3/08; G06N 3/0472; G06F 30/30; H01L 22/20; G06T 7/0004;
(Continued)

(56) References Cited

U.S. PATENT DOCUMENTS 9,633,282 B2  4/2017  Sharma et al.
9,697,444 B2  7/2017  Wu et al.
(Continued)

FOREIGN PATENT DOCUMENTS

CN  107408209 A  11/2017
CN  107481231 A  12/2017
(Continued)

OTHER PUBLICATIONS

S. Reed, H. Lee, D. Anguelov, C. Szegedy, D. Erahn, A. Rabinovich, "Training Deep Neural Networks on Noisy Labels With Bootstrapping," at arXiv, Apr. 15, 2015 (version 3).
(Continued)

*Primary Examiner* — Paul Dinh
(74) *Attorney, Agent, or Firm* — Volentine, Whitt & Francos, PLLC

(57) ABSTRACT

A method for detecting defects in a semiconductor device includes pre-training a pre-trained convolutional neural network (CNN) model using a sampled clean data set extracted from a first data set; training a normal convolutional neural network model and a label-noise convolutional neural network model using first data of the first data set and the pre-trained convolutional neural network model. The method also includes outputting a first prediction result on whether second data of a second data set is good or bad using the second data and the normal convolutional neural network model; and outputting a second prediction result on whether second data is good or bad using the second data and the label-noise convolutional neural network model. The first prediction result is compared with the second prediction result to perform noise correction when there is a label difference. Third data created as results of the noise correction is added to the sampled clean data set. The normal convolutional neural network model and the label-noise
(Continued)

convolutional neural network model are additionally using the sampled clean data set with the third data added.

20 Claims, 10 Drawing Sheets

(58) Field of Classification Search
CPC . G06T 2207/20081; G06T 2207/20084; G06T 2207/30148; G06T 7/001; G06K 9/6223; G01N 21/8803
USPC .......................................................... 706/16
See application file for complete search history.

(56) References Cited

U.S. PATENT DOCUMENTS

| | | |
|---|---|---|
| 2013/0294680 A1 | 11/2013 | Harada et al. |
| 2016/0163035 A1 | 6/2016 | Chang et al. |
| 2016/0358035 A1 | 12/2016 | Ruan et al. |
| 2018/0060702 A1 | 3/2018 | Ma et al. |
| 2022/0004935 A1* | 1/2022 | Lakshmanan ........ G06N 3/0454 |

FOREIGN PATENT DOCUMENTS

| | | |
|---|---|---|
| JP | 2018005520 A | 1/2018 |
| KR | 20180044295 A | 5/2018 |

OTHER PUBLICATIONS

B. Frenay, M. Verleysen, "Classification in the Presence of Label Noise: a Survey", in IEEE Transactions on Neural Networks and Learning Systems (vol. 25, Issue: 5), Dec. 17, 2013, pp. 845-869.
A. Vahdat, "Toward Robustness Against Label Noise in Training Deep Discriminative Neural Networks", at Advances in Neural Information Processing Systems 30 (NIPS 2017).
J. Zhang, Z. Lin, J. Brandt, X. Shen, S. Sclaroff, "Top-Down Neural Attention by Excitation Backprop", at European Conference on Computer Vision, Sep. 17, 2016.
R. R. Selvaraju, A. Das, R. Vedantam, M. Cogswell, D. Parikh, D. Batra, "Grad-CAM: Why Did You Say That?", at arXiv, Jan. 25, 2017 (version 2).
K. H. Lee, X. He, L. Zhang, L. Yang, "CleanNet: Transfer Learning for Scalable Image Classifier Training with Label Noise," at arXiv, Mar. 25, 2018 (version 2).

* cited by examiner

52

METHOD FOR DETECTING DEFECTS IN SEMICONDUCTOR DEVICE

CROSS-REFERENCE TO RELATED APPLICATION

This U.S. non-provisional patent application claims priority to Korean Patent Application No. 10-2018-0087488, filed on Jul. 27, 2018 in the Korean Intellectual Property Office, the disclosure of which is incorporated herein by reference in its entirety.

BACKGROUND

1. Field of the Disclosure

The present disclosure relates to a method for detecting defects in semiconductor devices.

2. Description of the Related Art

Techniques for detecting defects occurring during a process of fabricating a semiconductor device are being used. In particular, in order to detect defects in a semiconductor device, techniques using machine learning such as artificial neural networks (ANNs) are attracting attention.

In order to apply such techniques, a large amount of image data associated with the fabrication of semiconductor devices is required, along with labeling the image data to indicate whether the image data is good or bad. Unfortunately, manually labeling a large amount of image data in a fabrication defect detection process consumes much time and cost. Further, even after the image data has been labeled, the labelled image data may include noise.

Accordingly, what is required is an approach that can reliably determine whether there is a defect on image data items including unlabeled image data or noise-labeled image data in order to automatically detect defects occurring during the process of fabricating a semiconductor device by using a machine learning technique.

SUMMARY

Aspects of the present disclosure provide a method for detecting defects in a semiconductor device even for non-labeled image data or improperly labeled image data by using a convolutional neural network (CNN).

Aspects of the present disclosure also provide a method for detecting and classifying defects in a semiconductor device even for non-labeled image data or improperly labeled image data by using a convolutional neural network.

According to an aspect of the present disclosure, a method for detecting defects in a semiconductor device including pre-training a pre-trained convolutional neural network model using a sampled clean data set extracted from a first data set; and training a normal CNN model and a label-noise CNN model using first data of the first data set and the pre-trained CNN model. The method also includes outputting a first prediction result on whether second data of a second data set is good or bad using the second data and the normal CNN model; and outputting a second prediction result on whether the second data is good or bad using the second data and the label-noise CNN model. The first prediction result is compared with the second prediction result to perform noise correction when there is a label difference; third data created as results of the noise correction is added to the sampled clean data set; and the normal CNN model and the label-noise CNN model are additionally trained using the sampled clean data set with the third data added.

According to another aspect of the present disclosure, a method for detecting defects in a semiconductor device including first training a normal convolutional neural network model and a label-noise CNN model using first data of a first data set and a pre-trained CNN model. The method also includes outputting a first prediction result on whether second data of a second data set is good or bad using the second data and the normal CNN model; and outputting a second prediction result on whether the second data is good or bad using the second data and the label-noise CNN model. The first prediction result is compared with the second prediction result to perform noise correction when there is a label difference. The pre-trained CNN model is additionally trained for the third data created as results of the noise correction. The normal CNN model and the label-noise CNN model are second trained using the pre-trained CNN model that is additionally trained for the third data. A third prediction results on whether the first data is good or bad is output using (based on) the first data and the normal CNN model. A fourth prediction result on whether the first data is good or bad is output using (based on) the first data and the label-noise CNN model. The third prediction result is compared with the fourth prediction result to additionally perform the noise correction when there is the label difference; and the pre-trained CNN model for the fourth data created as results of the additionally performed noise correction is additionally trained.

According to still another aspect of the present disclosure, a method for detecting defects in a semiconductor device including pre-training a pre-trained convolutional neural network model using a sampled clean data set extracted from a first data set; and training a normal CNN model and a label-noise CNN model using first data of the first data set and the pre-trained CNN model. The method also includes outputting a first prediction result on whether second data of a second data set is good or bad using the second data and the normal CNN model; and outputting a second prediction result on whether the second data is good or bad using the second data and the label-noise CNN model. The first prediction result is compared with the second prediction result to visualize the bad data based on a clean data set created after a label has been corrected, when there is no label difference.

These and other aspects, embodiments and advantages of the present disclosure will become immediately apparent to those of ordinary skill in the art upon review of the Detailed Description and Claims to follow.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Hereinafter, example embodiments of the present disclosure will be described in detail with reference to the accompanying drawings.

Figure 1:
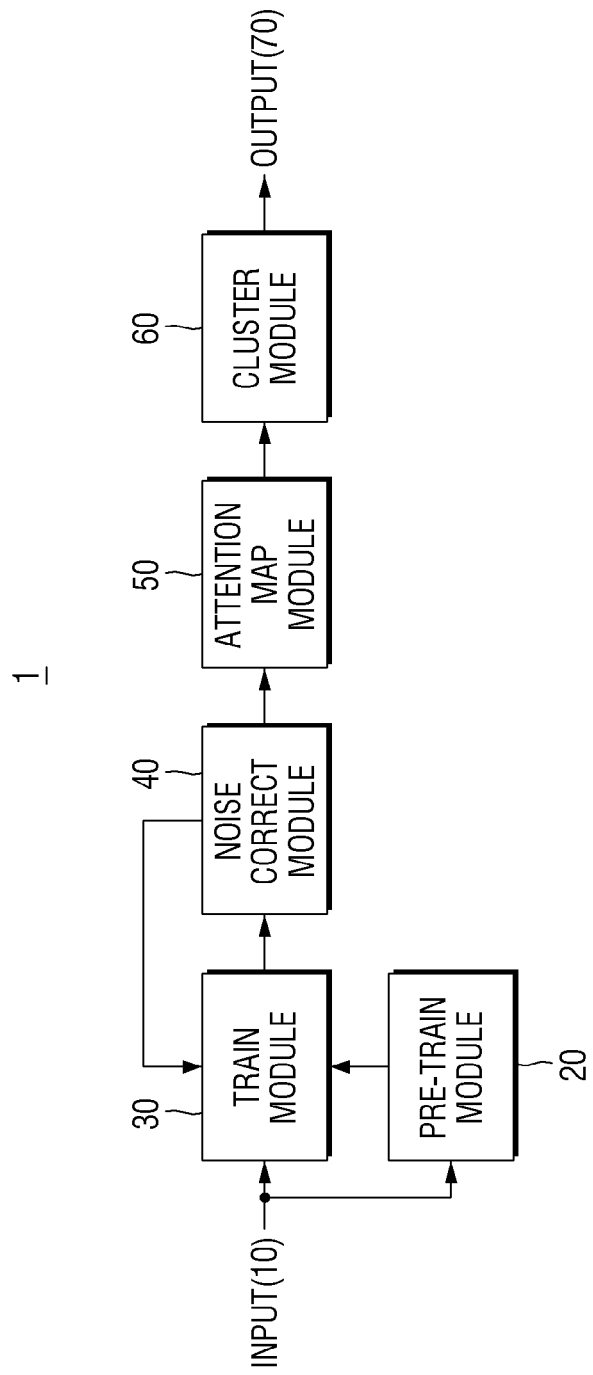
FIG. 1 is a block diagram for illustrating a defect detecting system for a semiconductor device according to an example embodiment of the present disclosure.

FIG. 1 is a block diagram for illustrating a defect detection system for a semiconductor device according to an example embodiment of the present disclosure.

Referring to FIG. 1, a defect detection system 1 for a semiconductor device according to an example embodiment of the present disclosure automatically detects defects occurring during the process of fabricating a semiconductor device by using machine learning, especially deep learning. Deep learning is a type of machine learning that is based on artificial neural networks. Neural networks are machine learning tools implemented by processors executing software and modeled after the human brain. Neural networks work by "learning" by incorporating new data. The defect detection system 1 improves the learning quality of neural networks that have levels becoming deeper by preprocessing learning data through unsupervised learning. Unsupervised learning is a branch of machine learning that learns from unclassified test data (i.e., or e.g., unlabeled test data and/or uncategorized test data). Such machine learning is well known in the art and thus will not be described herein. As should be clear from the start, the data fed to the defect detection system 1 for the machine learning is image data for detecting defects occurring during the process of fabricating a semiconductor device. For example, a fabrication facility may have a network of imaging devices (e.g., cameras) that systematically capture images of semiconductor devices as they are being processed. Thus, in embodiments the defect detection system 1 may be implemented by a semiconductor fabricator, and may be implemented as part of a semiconductor fabrication process or a semiconductor defect detection process. In other embodiments, the defect detection system may be implemented remove from a semiconductor fabrication facility, and even by a third-party entity different from the semiconductor fabricator.

According to an example embodiment of the present disclosure, an input 10 may include a large amount of image data for detecting defects occurring during the process of fabricating a semiconductor device, e.g., a large amount of semiconductor process image data of fabricating a semiconductor device. The image data of the input 10 may be obtained, retrieved, received, stored and otherwise input based on the imaging of the semiconductor(s) during and after the semiconductor fabrication process. The input 10 may include labeled image data indicating whether the data is good or bad (hereinafter referred to as "labelled image data") as well as unlabeled data (hereinafter referred to as "non-labeled image data"). Bad image data may be image data that shows or otherwise reflects a defect in a semiconductor device undergoing the fabrication process.

Herein, the labelled image data may include labelled image data that is properly labeled and does not require correction, and "noise-labelled image data" that is not properly labeled and thus requires correction.

It is to be noted that the non-labeled image data may be regarded as noise-labelled image data when the image data is divided into good image data and bad image data.

The defect detection system 1 may automatically detect and classify defects for the input 10 including the non-labeled image data and the noise-labelled image data. To this end, the defect detection system 1 includes a pre-train module 20, a train module 30, a noise correct module 40, an attention map module 50, and a cluster module 60.

The pre-train module 20 receives the input 10 and pre-trains the pre-trained CNN model 200. To this end, the pre-train module 20 may receive a sampled clean data set 110 from the input 10. A method for detecting defects in a semiconductor device may include pre-training the pre-trained convolutional neural network model (e.g., the pre-trained CNN model 200) using the sampled clean data set 110 extracted from a first data set received as the input 10.

The sampled clean data set 110 includes some image data sampled from a large amount of image data corresponding to the input 10. In particular, the sampled clean data set 110 may be configured to include only properly labeled image data, to perform pre-training corresponding to the preprocessing of the operation of the defect detection system 1 for the semiconductor device.

The pre-train module 20 pre-trains the pre-trained CNN model 200 based on the labelled image data that is properly labeled, and provides the results to the train module 30.

The train module 30 receives the input 10 and trains a normal CNN model 300 and a label-noise CNN model 310. The normal CNN model 300 detects a noise label in training data, whereas the label-noise CNN model 310 predicts a label and then detects a noise label by itself by referring to the label indicated in the training data and also to the label that the label-noise CNN model 310 predicted by itself. As explained later, the label-noise CNN model 310 may use a bootstrapping technique. Specifically, the train module 30 performs learning on the normal CNN model 300 and the label-noise CNN model 310 using the results of the pre-train module 20.

Further, the train module 30 receives the input 10 and uses the normal CNN model 300 to predict whether the input 10 is good or bad. In addition, the train module 30 also uses the label-noise CNN model 310 to predict whether the input 10 is good or bad. In addition, the train module 30 provides the prediction results to the noise correct module 40.

The noise correct module 40 compares the prediction results received from the train module 30 with each other to determine whether or not a label is to be corrected, and performs label correction if necessary. When the label is corrected, the noise correct module 40 provides the image data with the corrected label to the train module 30 so that the train module 30 can perform training again using the corrected image data.

The attention map module 50 provides an attention map that visually represents which region of the image data the CNN has used to classify the labels. That is to say, the attention map allows a user to visually identify which region of the image data the CNN has used to classify the labels. Insofar as the attention map may be a visualization of bad data, a method for detecting defects in a semiconductor device may include generating a visualization of bad data based on a clean data set created after the sampled clean data set 110 has been updated.

If it is determined that image data is defective, the cluster module 60 performs clustering on the image data determined to be defective (or "bad data") according to the attributes of the defects detected from the bad data. Herein, the "attributes of a defect" may mean, for example, attributes such as the type, shape, position and size of the defect in the bad data, but the scope of the present disclosure is not limited thereto.

The defect detection system 1 has advantages in that it can automatically create and correct labels for the non-labeled image data and the noise-labelled image data so that defects during the process of fabricating a semiconductor device can be detected and classified without manually adding or correcting labels. Detected defects can be used to discard or repair defective semiconductor devices, and also to identify required modifications to the semiconductor fabrication process.

The defect detection system illustrated in FIG. 1 may be a computer system that includes one or more computing devices that each include one or more processors. A processor for a computer system is tangible and non-transitory. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. A processor is an article of manufacture and/or a machine component. A processor for a computer system that implements the defect detection system in FIG. 1 is configured to execute software instructions to perform functions as described in the various embodiments herein. A processor for a computer system may be a general-purpose processor or may be part of an application specific integrated circuit (ASIC). A processor for a computer system may also be a microprocessor, a microcomputer, a processor chip, a controller, a microcontroller, a digital signal processor (DSP), a state machine, or a programmable logic device. A processor for a computer system may also be a logical circuit, including a programmable gate array (PGA) such as a field programmable gate array (FPGA), or another type of circuit that includes discrete gate and/or transistor logic. A processor may be a central processing unit (CPU), a graphics processing unit (GPU), or both. Additionally, any processor described herein may include multiple processors, parallel processors, or both. Multiple processors may be included in, or coupled to, a single device or multiple devices.

A computer system that implements the defect detection system in FIG. 1 may implement all or parts of the methods described herein. For example, functionality such as pre-training, training, outputting, comparing, adding, determining, correcting, visualizing, and so on as described herein may be implemented by a computer system executing software instructions via a processor or processors described above.

Hereinafter, a method for detecting defects in a semiconductor device according to a variety of example embodiments of the present disclosure is explained on the basis of the description of the defect detection system 1.

Figure 2:
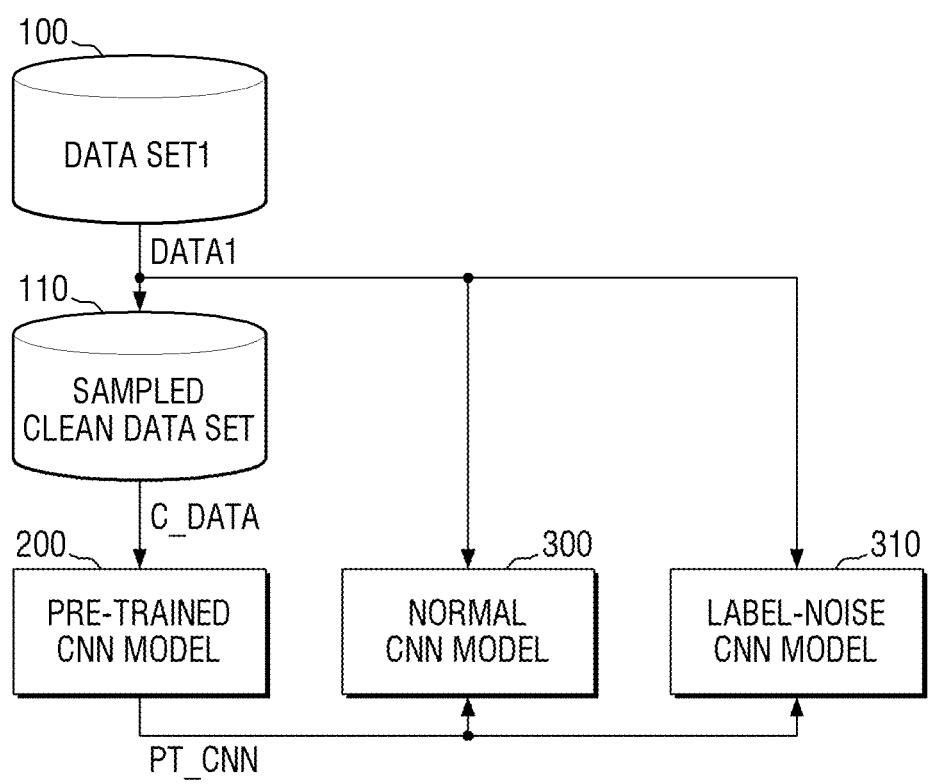
FIG. 2 is a diagram for illustrating a method for detecting defects in a semiconductor device according to an example embodiment of the present disclosure.

FIG. 2 is a diagram for illustrating a method for detecting defects in a semiconductor device according to an example embodiment of the present disclosure.

Referring to FIG. 2, the method includes pre-training a pre-trained CNN model 200 using a sampled clean data set 110 extracted from a first data set 100.

Specifically, the input 10 of FIG. 1 may include a large amount of semiconductor process image data for detecting defects during the process of fabricating a semiconductor device. The large amount of process image data is divided into the first data set 100 and a second data set 102. Each of the first data set 100 and the second data set 102 may include labelled image data, noise-labelled image data, and non-labeled image data.

According to example embodiments of the present disclosure, the sampled clean data set 110 refers to a data set that includes only the image data properly labeled for detecting defects in a semiconductor device, i.e., clean data C_DATA among the first data set 100 that includes the labelled image data, the noise-labelled image data, and non-labeled image data.

The pre-training for the pre-trained CNN model 200 is performed using the clean data C_DATA provided from the sampled clean data set 110.

Subsequently, the method according to the example embodiment of FIG. 2 includes training the normal CNN model 300 and the label-noise CNN model 310 using the first data DATA1 of the first data set 100 and the pre-trained CNN PT_CNN provided from the pre-trained CNN model 200.

Figure 3:
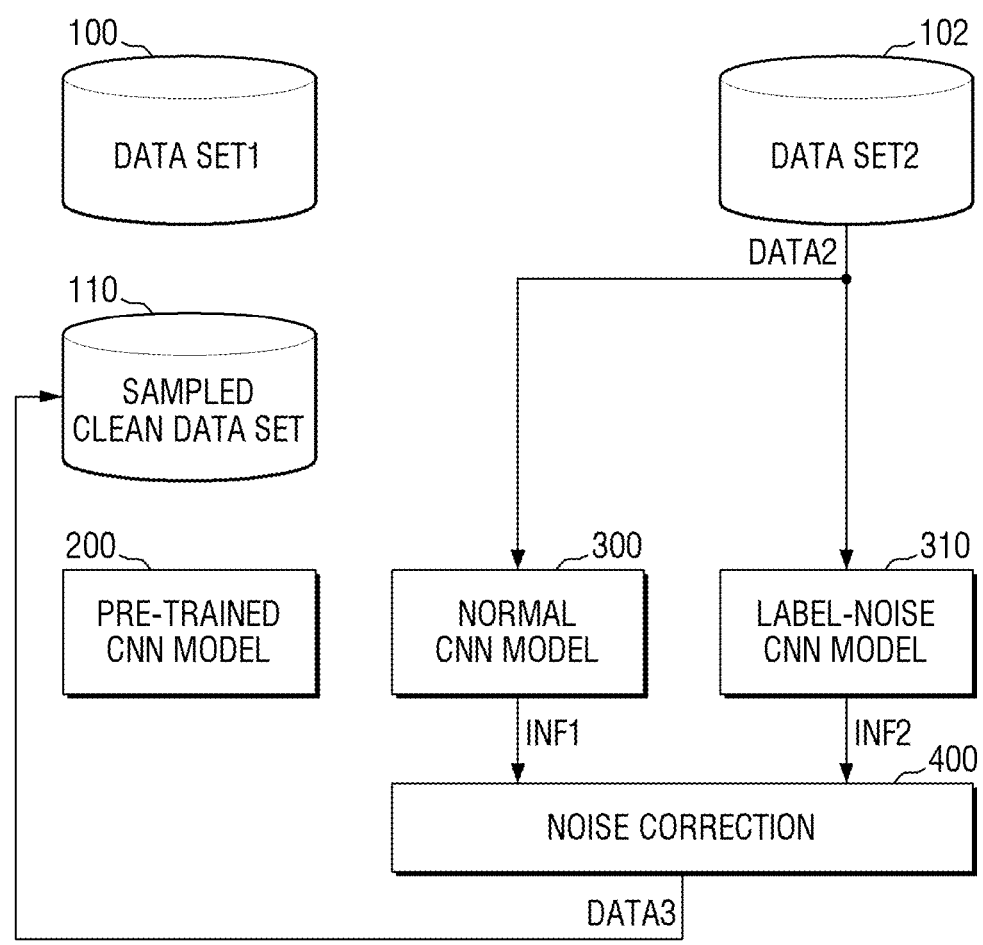
FIG. 3 is a diagram for illustrating a method for detecting defects in a semiconductor device according to an example embodiment of the present disclosure.

FIG. 3 is a diagram for illustrating a method for detecting defects in a semiconductor device according to an example embodiment of the present disclosure.

Referring to FIG. 3, the method according to an example embodiment of the present disclosure includes using second data DATA2 of the second data set 102 and the normal CNN model 300 to predict whether the second data DATA2 is good or bad. As a result, a first prediction result INF1 is output.

The second data set 102 includes labelled image data, noise-labelled image data, and non-labeled image data. The predicting whether data is good or bad refers to inferring whether the second data DATA2 is good or bad based on the training described above with reference to FIG. 2.

The method according to the example embodiment of FIG. 3 includes using second data DATA2 of the second data set 102 and the label-noise CNN model 310 to predict whether the second data DATA2 is good or bad. As a result, a second prediction result INF2 is output.

It is to be noted that the difference between the label-noise CNN model 310 and the normal CNN model 300 is that the label-noise CNN model 310 can detect a noise label by itself.

In order to detect a noise label by itself, the label-noise CNN model 310 may refer not only to the label indicated in the training data but also to the label that the label-noise CNN model 310 predicted by itself. For example, a bootstrapping technique may be used.

The bootstrapping technique uses a bootstrapping loss function as a loss function to calculate the target value of the loss function by referring to the label of the training data as well as the label predicted by the model itself. An example that shows that a noise label can be detected by applying such a bootstrapping technique is disclosed, for example, in *Training Deep Neural Networks on Noisy Labels with Bootstrapping* by Reed et al., ICLR 2015.

According to example embodiment of FIG. 3, the label-noise CNN model 310 may be, but is not limited to, a model employing a bootstrapping technique using a bootstrapping loss function as a loss function. That is to say, the label-noise CNN model 310 may include a model implemented with any algorithm capable of detecting a noise label by itself.

Subsequently, the method according to the example embodiment of FIG. 3 includes performing noise correction 400 if there is a label difference by comparing a first prediction result INF1 with a second prediction result INF2.

Specifically, there is a label difference if a label predicted or inferred by the normal CNN model 300 for image data is different from a label predicted or inferred by the label-noise CNN model 310 for the same image data. For example, for given image data that the normal CNN model 300 determined to be good and accordingly assigned a label indicative of good image data, the label-noise CNN model 310 may determine that the image data is bad and accordingly may assign a label indicative of bad image data.

When this happens, it is necessary to labelled image data properly. Accordingly, the noise correction 400 is performed on the image data. An example of the noise correction 400 will be described in detail later with reference to FIG. 4.

Subsequently, the method according to FIG. 4 includes adding the third data DATA3 created as a result of the noise correction to the sampled clean data set 110. Specifically, the third data DATA3 corresponds to the image data that was determined as having a noise label but the label has been corrected to a proper label. By performing the procedures described with reference to FIG. 3, the sampled clean data set 110 may be updated over and over.

Figure 4:
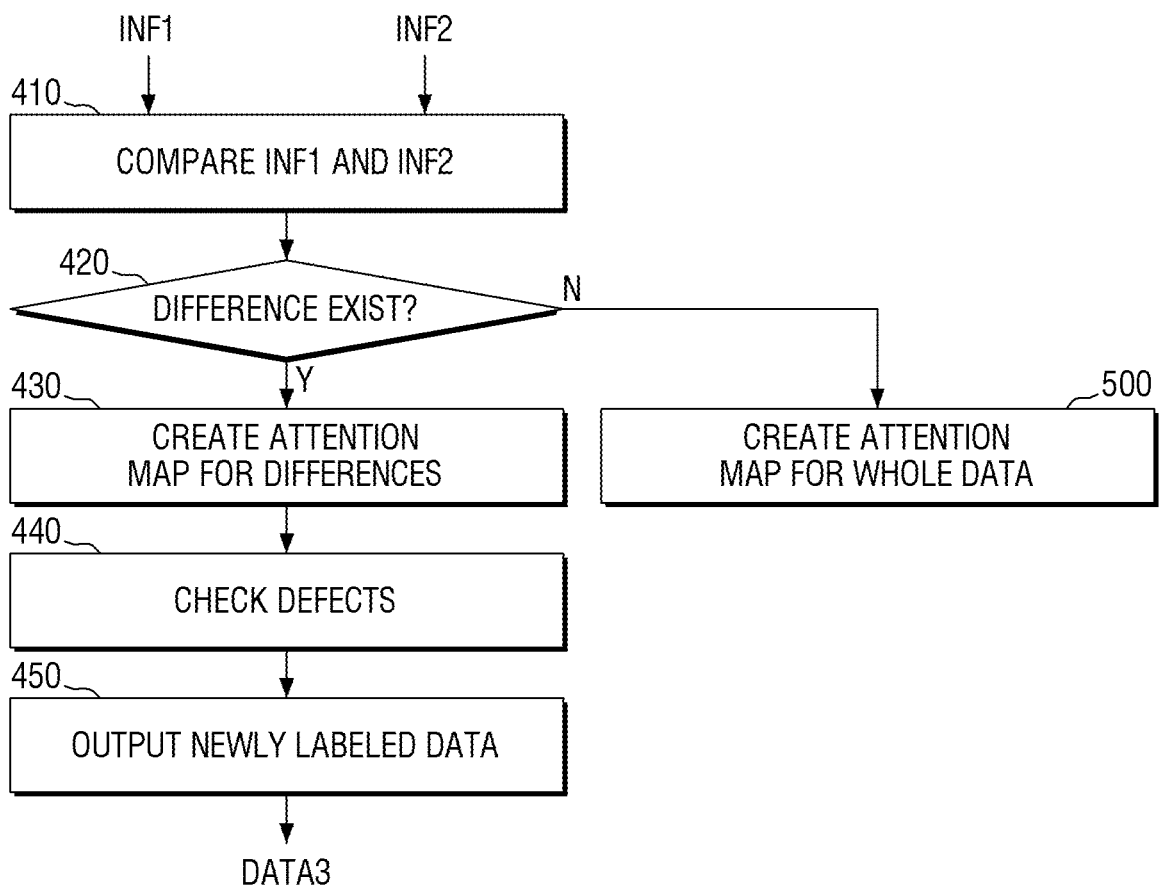
FIG. 4 is a diagram for illustrating a method for detecting defects in a semiconductor device according to an example embodiment of the present disclosure.

FIG. 4 is a diagram for illustrating a method for detecting defects in a semiconductor device according to an example embodiment of the present disclosure.

Referring to FIG. 4, an example of the noise correction described with reference to FIG. 3 is shown.

Initially, a first prediction result INF1 according to the normal CNN model 300 is compared with a second prediction result INF2 according to the label-noise CNN model 310 (step S410), and it is determined if there is a difference between the first prediction result INF1 and the second prediction result INF2 (step S420).

If there is no difference between the first prediction result INF1 and the second prediction result INF2, the process proceeds to step S500, which will be described with reference to FIG. 8.

Alternatively, if there is a difference between the first prediction result INF1 and the second prediction result INF2, an attention map for the data having the difference, i.e., the label difference, is created (step S430). Subsequently, it is determined whether there is a defect for the second data DATA2 using the created attention map (step S440).

As described above, the attention map allows a user to visually identify which region of the image data the CNN has used to classify the labels. Specifically, the attention map has characteristics of a two-dimensional discrete distribution having a specific value for each pixel on the image data. Such a value becomes larger toward a position predicted to be defective. Therefore, it is possible to quickly check if there is a defect on image data and the position and shape of the image data through the attention map. An example of the attention map is the class activation map technique introduced in *Learning Deep Features for Discriminative Localization* by Zhou et al, CVPR, 2016.

According to the example embodiments such as the embodiment of FIG. 4, the attention map may be created (step S430) by using the class activation map technique, but the present disclosure is not limited thereto. That is to say, the creating the attention map (step S430) may include a method implemented with any algorithm that allows a user to see which region of the image data the CNN has used to classify the label.

Thereafter, the label for the second data DATA2 is corrected depending on whether there is a defect, and the newly labeled image data is output as the third data DATA3 (step S450). The output third data DATA3 may be added to the sampled clean data set 110 as described above with reference to FIG. 3 so that the sampled clean data set 110 can be updated.

Figure 5:
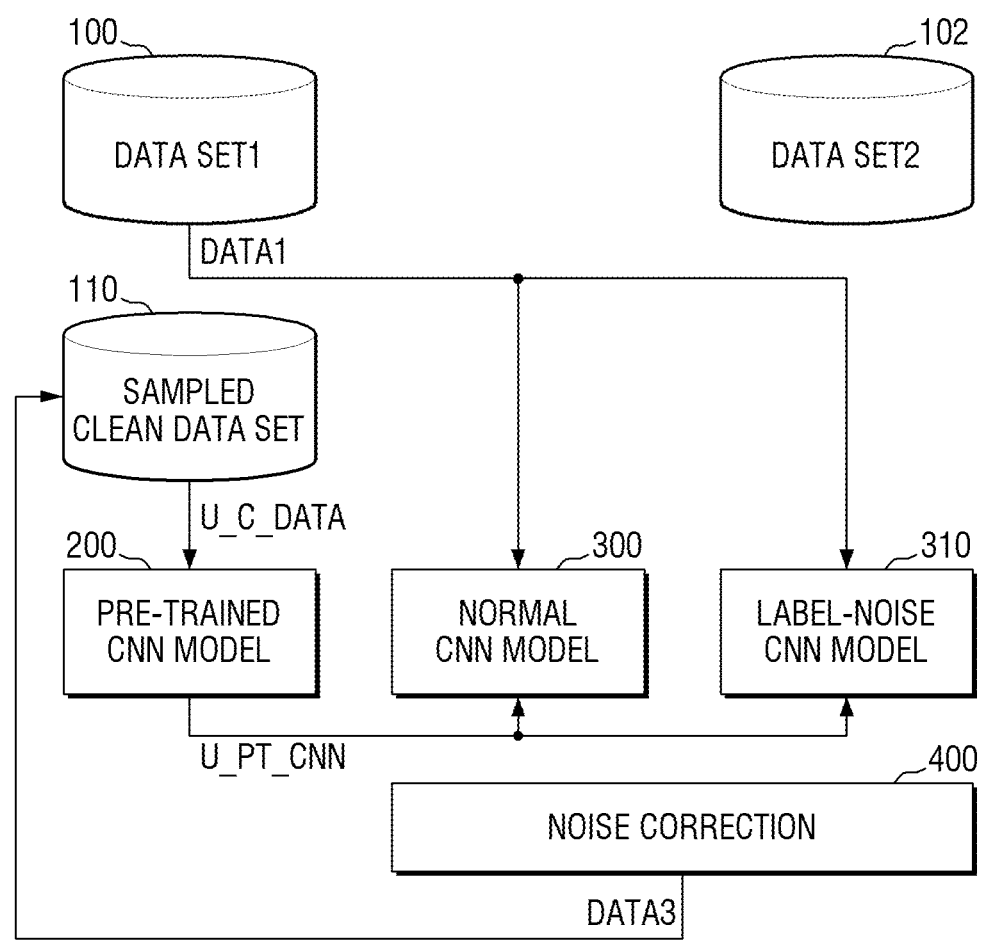
FIG. 5 is a diagram for illustrating a method for detecting defects in a semiconductor device according to an example embodiment of the present disclosure.

FIG. 5 is a diagram for illustrating a method for detecting defects in a semiconductor device according to an example embodiment of the present disclosure.

Referring to FIG. 5, the method includes additionally pre-training a pre-trained CNN model 200 using a sampled clean data set 110 that was updated by adding the third data DATA3 to it.

According to the example embodiment of FIG. 5, the sampled clean data set 110 refers to a data set that includes only the image data properly labeled for detecting defects in a semiconductor device and updated clean data U_C_DATA to which the third data DATA3 received through the process illustrated in FIGS. 3 and 4 is added. The pre-training the pre-trained CNN model 200 is performed using the updated clean data U_C_DATA provided from the sampled clean data set 110.

Subsequently, the method according to the example embodiment of FIG. 5 includes additionally training the normal CNN model 300 and the label-noise CNN model 310 using the updated pre-trained CNN PT_CNN provided from the pre-trained CNN model 200 which was additionally pre-trained with the updated clean data U_C_DATA. In other words, the method according to the embodiment of FIG. 5 includes second training the normal CNN model 300 and the label-noise CNN model 310 using the pre-trained CNN model additionally trained for the third data DATA3. The pre-trained CNN model is pre-trained in pre-training using the sampled clean data set extracted from the first data set.

Figure 6:
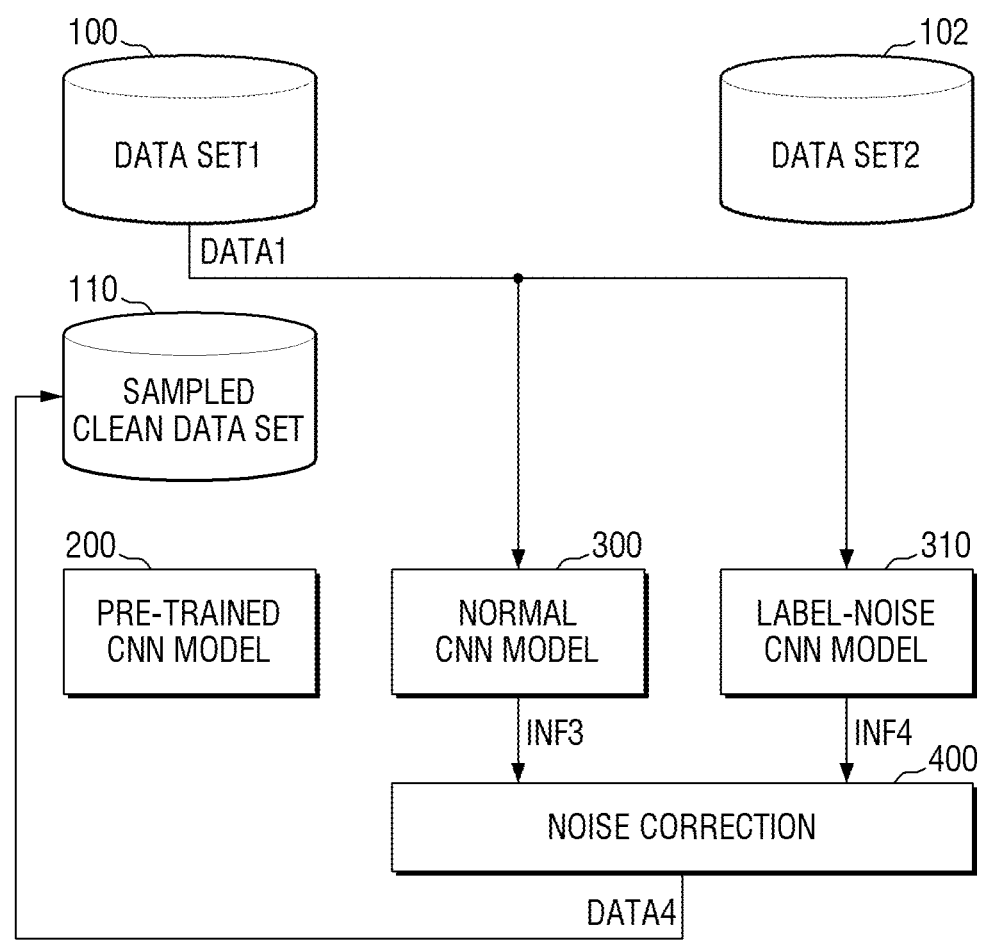
FIG. 6 is a diagram for illustrating a method for detecting defects in a semiconductor device according to an example embodiment of the present disclosure.

FIG. 6 is a diagram for illustrating a method for detecting defects in a semiconductor device according to an example embodiment of the present disclosure.

Referring to FIG. 6, the method according to example embodiments of the present disclosure includes using first data DATA1 of the first data set 100 and the normal CNN model 300 to predict whether the first data DATA1 is good or bad. As a result, a third prediction result INF3 is output.

The method according to the example embodiment of FIG. 6 includes using first data DATA1 of the first data set 100 and the label-noise CNN model 310 to predict whether the first data DATA1 is good or bad. As a result, a fourth prediction result INF4 is output.

As described above, according to the example embodiment of FIG. 6, the label-noise CNN model 310 may be, but is not limited to, a model employing a bootstrapping technique using a bootstrapping loss function as a loss function.

That is to say, the label-noise CNN model 310 may include a model implemented with any algorithm capable of detecting a noise label by itself.

Subsequently, the method according to the example embodiment of FIG. 6 includes additionally performing noise correction 400 if there is a label difference by comparing a third prediction result INF3 with a fourth prediction result INF4.

Subsequently, the method according to the example embodiment of FIG. 6 includes adding the fourth data DATA4 created as results of the noise correction to the sampled clean data set 110. That is to say, the fourth data DATA4 corresponds to the image data that was determined as a noise label but is corrected to be a proper label. By performing the procedures described in FIG. 3, the sampled clean data set 110 may be updated over and over.

Figure 7:
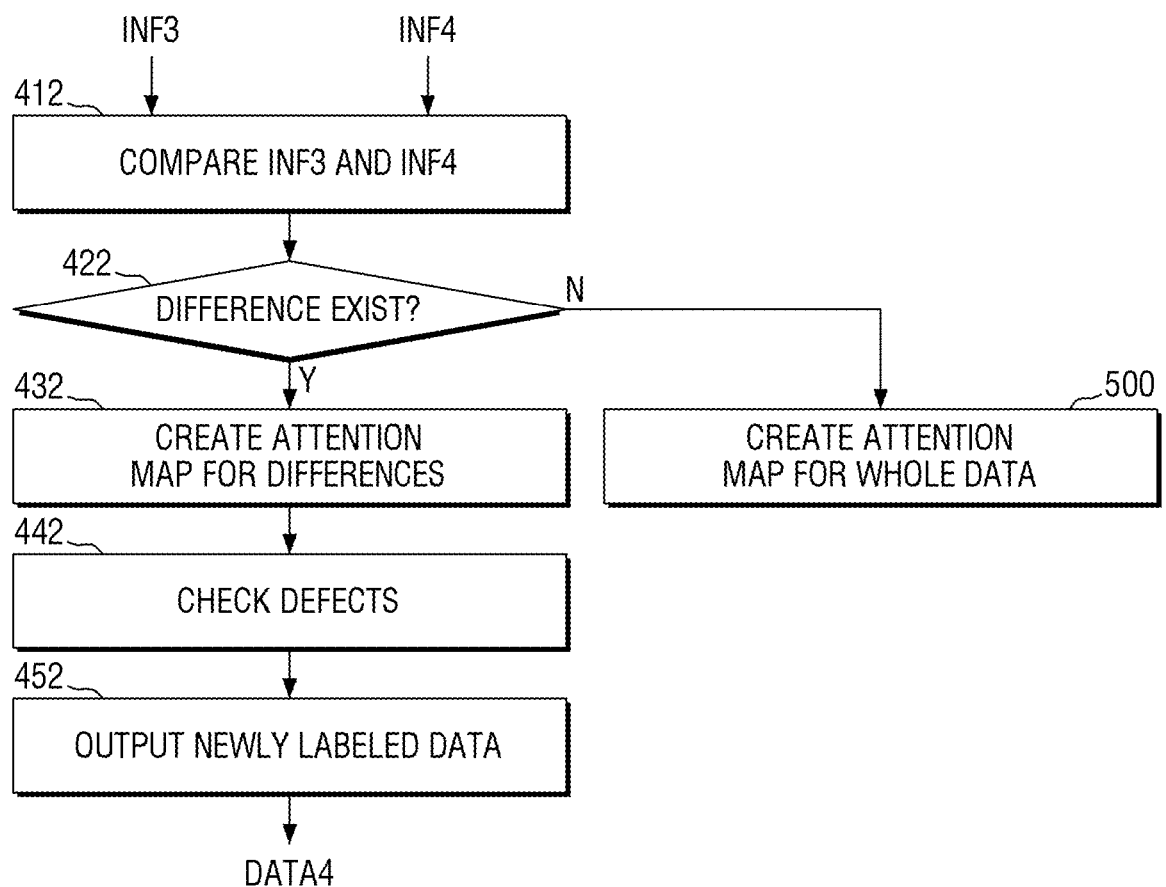
FIG. 7 is a diagram for illustrating a method for detecting defects in a semiconductor device according to an example embodiment of the present disclosure.

FIG. 7 is a diagram for illustrating a method for detecting defects in a semiconductor device according to an example embodiment of the present disclosure.

Referring to FIG. 7, an example of the noise correction described with reference to FIG. 6 is shown.

Initially, a third prediction result INF3 according to the normal CNN model 300 is compared with a fourth prediction result INF4 according to the label-noise CNN model 310 (step S412), and it is determined if there is a difference between the third prediction result INF3 and the fourth prediction result INF4 (step S422).

If there is no difference between the third prediction result INF3 and the fourth prediction result INF4, the process proceeds to step S500, which will be described with reference to FIG. 8.

Alternatively, if there is a difference between the third prediction result INF3 and the fourth prediction result INF4, an attention map for the data having the difference, i.e., the label difference, is created (step S432). Subsequently, it is determined whether there is a defect for the first data DATA1 using the created attention map (step S442).

As described above, according to example embodiments of the present disclosure such as the embodiment of FIG. 7, the attention map may be created (step S430) by using the class activation map technique, but the present disclosure is not limited thereto. That is to say, the creating the attention map (step S432) may include a method implemented with any algorithm that allows a user to see which region of the image data the CNN has used to classify the label.

Thereafter, the label for the first data DATA1 is corrected depending on whether there is a defect, and the newly labeled image data is output as the fourth data DATA4 (step S452). The output fourth data DATA4 may be added to the sampled clean data set 110 as described above with reference to FIG. 6 so that the sampled clean data set 110 can be updated.

Figure 8:
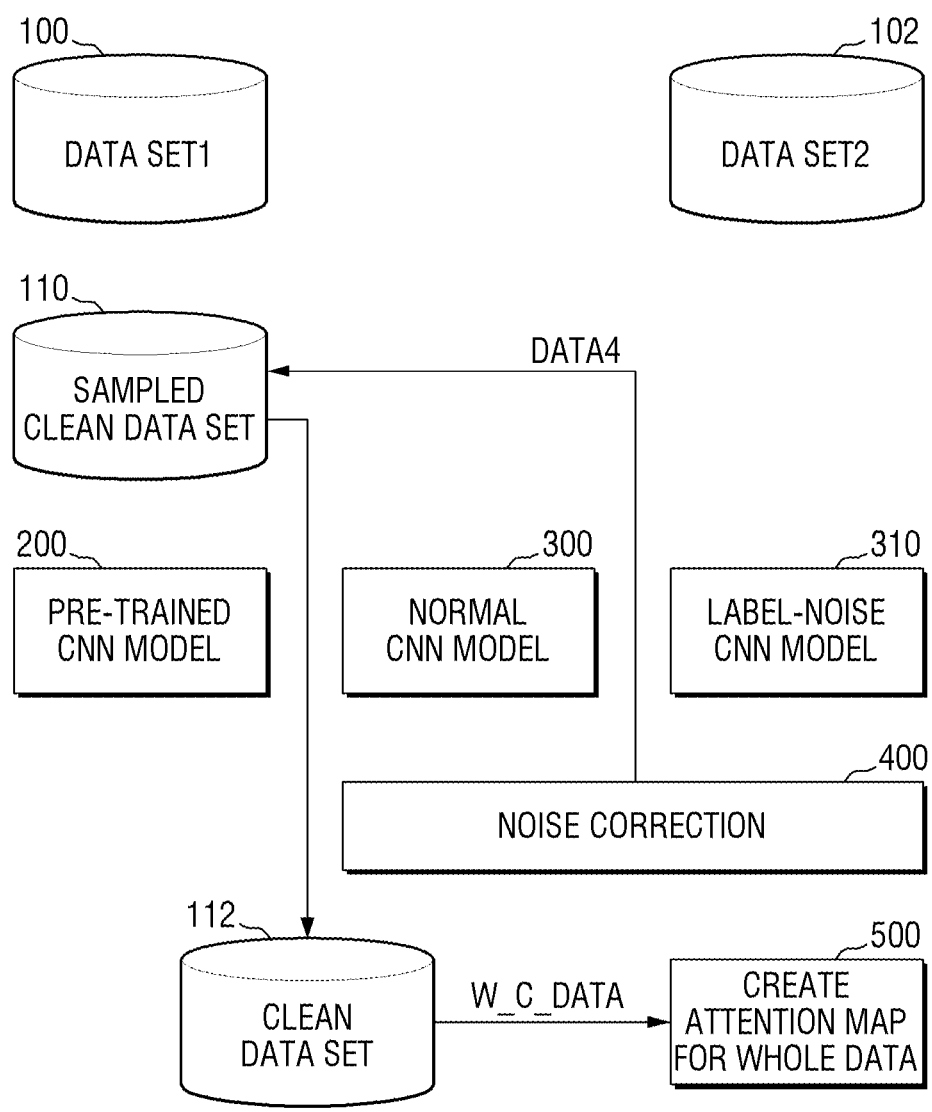
FIG. 8 is a diagram for illustrating a method for detecting defects in a semiconductor device according to an example embodiment of the present disclosure.
Figure 9:
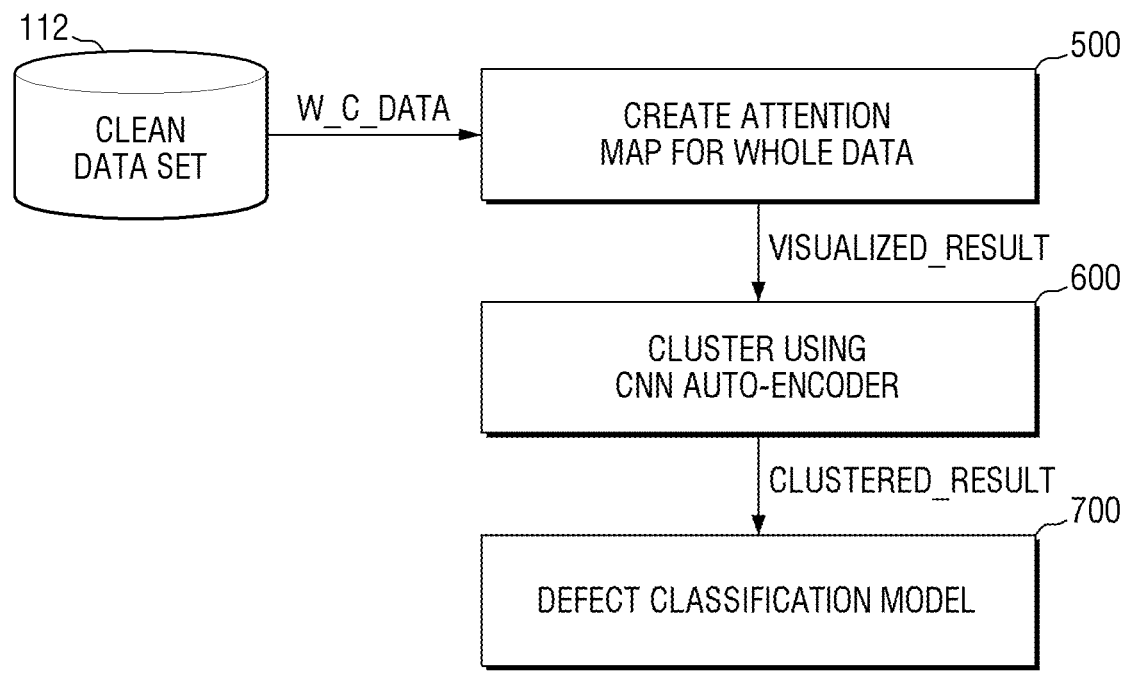
FIG. 9 is a diagram for illustrating a method for detecting defects in a semiconductor device according to an example embodiment of the present disclosure.

FIG. 8 is a diagram for illustrating a method for detecting defects in a semiconductor device according to an example embodiment of the present disclosure. FIG. 9 is a diagram for illustrating a method for detecting defects in a semiconductor device according to an example embodiment of the present disclosure.

Referring to FIGS. 8 and 9, the method according to example embodiments of the present disclosure may include visualizing bad data based on the clean data set 112 of the updated sampled clean data set 110 if there is no label difference.

Specifically, an attention map is created for all the clean data W_C_DATA of the clean data set 112 (step S500). Then, it is possible to visually check defects for all the clean data W_C_DATA from the created attraction map. That is to say, it is possible to visualize bad data thanks to the attention map. A method for detecting defects in a semiconductor device may thus include generating a visualization of bad data based on a clean data set created after the sampled clean data set has been updated.

As described above, according to the example embodiments of FIGS. 8 and 9, the attention map may be created (step S500) by using the class activation map technique, but the present disclosure is not limited thereto. That is to say, the creating the attention map (step S500) may include a method implemented with any algorithm that allows a user to see which region of the image data the CNN has used to classify the label.

Furthermore, the method according to the example embodiments of FIGS. 8 and 9 may include performing clustering on the bad data according to the attributes of defects detected from bad data, i.e., the type, shape, position, size, etc. of the defects in the bad data. To this end, for example, the method may perform image processing, such as cropping a desired region in the attention map.

In some example embodiments of the present disclosure, the performing clustering on bad data may include performing clustering (e.g., k-means clustering) on bad data using a convolutional neural network auto-encoder (a CNN auto-encoder).

The CNN auto-encoder maps data on a feature space of a higher dimension into a latent space of a lower dimension to extract latent variables and then maps the results of the mapping (or decoding) back into the feature space of the higher dimension so that the results become the same as the data before the encoding. Accordingly, clustering (e.g., k-means clustering) may be performed using the latent variables.

Furthermore, the method according to the example embodiments of FIGS. 8 and 9 may include creating a defect classification model for automatically classifying bad data by the attributes of defects based on the results of the clustering.

Figure 10:
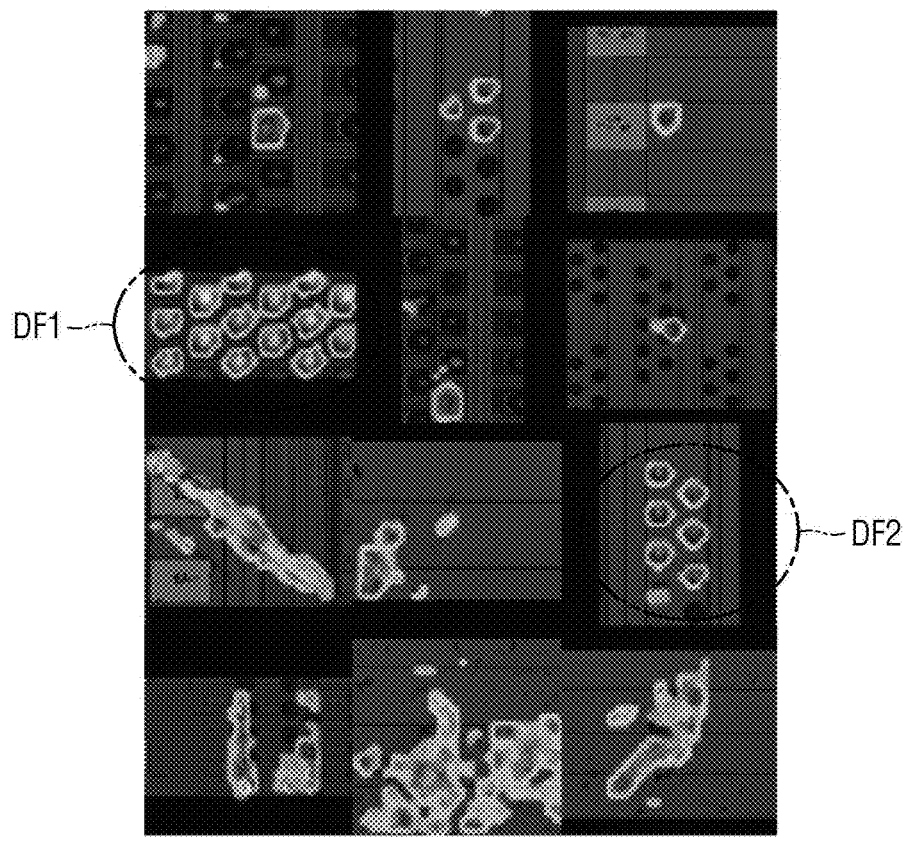
FIG. 10 is a picture showing visualized results obtained by the method for detecting defects in a semiconductor device according to an example embodiment of the present disclosure.

FIG. 10 is a picture showing visualized results obtained by the method for detecting defects in a semiconductor device according to an example embodiment of the present disclosure.

Referring to FIG. 10, attributes of the defects of bad data, i.e., type, shape, position, size and the like of the defects in the bad data can be visualized as indicated by 52 by using the attention map. For example, it is possible to visually check that a first defect DF1 is made of patterns of small defects, each pattern including three small defects at the first column and two small defects at the second column, and that a second defect DF2 is made of a zigzag pattern of small defects.

According to the defect detection system for the semiconductor device and the method for detecting defects in a semiconductor device described above, the clean data can be updated by comparing the prediction results from the CNN model capable of detecting the noise label by itself and the prediction results from the normal CNN model, and labels are automatically created and corrected for non-labeled image data and noise-labelled image data. Therefore, it is advantageous to detect and classify defects occurring during the process of fabricating a semiconductor device without manually adding or correcting labels.

Furthermore, the type, shape, position, size and the like of the defects can be visualized by using the attention map. In addition, clustering can be automatically performed on bad data according to the attributes of the defects detected from the bad data, i.e., the type, shape, position, size and the like.

In addition, based on the results of the clustering, a defect classification model can be created that automatically classifies bad data according to the attributes of the defects. Thus, automation specialized in classifying defects that may occur during the process of fabricating semiconductor devices can be achieved.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A method for detecting defects in a semiconductor device, the method comprising:
    pre-training a pre-trained convolutional neural network model using a sampled clean data set extracted from a first data set;
    training a normal convolutional neural network model and a label-noise convolutional neural network model using first data of the first data set and the pre-trained convolutional neural network model;
    outputting a first prediction result on whether second data of a second data set is good or bad using the second data and the normal convolutional neural network model;
    outputting a second prediction result on whether the second data is good or bad using the second data and the label-noise convolutional neural network model;
    comparing the first prediction result with the second prediction result to perform noise correction when there is a label difference;
    adding third data created as results of the noise correction to the sampled clean data set; and
    additionally training the normal convolutional neural network model and the label-noise convolutional neural network model using the sampled clean data set with the third data added.

2. The method of claim 1, wherein the noise correction performed when there is a label difference comprises:
    determining whether there is a defect in the second data using an attention map created for the label difference, and
    correcting a label for the second data when it is determined that there is a defect in the second data.

3. The method of claim 1, wherein the label-noise convolutional neural network model uses a bootstrapping loss function as a loss function.

4. The method of claim 1, further comprising:
    after additionally training the normal convolutional neural network model and the label-noise convolutional neural network model using the sampled clean data set,
    outputting a third prediction result on whether the first data is good or bad using the first data and the normal convolutional neural network mode; and
    outputting a fourth prediction result on whether the first data is good or bad using the first data and the label-noise convolutional neural network model.

5. The method of claim 4, further comprising:
    comparing the third prediction result with the fourth prediction result to additionally perform the noise correction when there is the label difference; and
    adding fourth data created as results of the additionally performed noise correction to the sampled clean data set.

6. The method of claim 1, further comprising:
    generating a visualization of bad data based on a clean data set created after the sampled clean data set has been updated when there is no label difference,
    wherein the visualization of the bad data is based on performing clustering on the bad data according to attributes of defects detected from the bad data, and
    wherein the visualization of the bad data is further based on creating a defect classification model that classifies the defects of the bad data by the attributes of the defects based on the results of the clustering.

7. The method of claim 1, further comprising:
    generating a visualization of bad data based on a clean data set created after the sampled clean data set has been updated when there is no label difference,
    wherein the visualization of the bad data is based on performing clustering on the bad data according to attributes of defects detected from the bad data, and
    wherein the performing the clustering on the bad data comprises performing clustering on the bad data using a convolutional neural network auto-encoder.

8. A method for detecting defects in a semiconductor device, the method comprising:
    first training a normal convolutional neural network (CNN) model and a label-noise convolutional neural network model using first data of a first data set and a pre-trained convolutional neural network model;
    outputting a first prediction result on whether second data of a second data set is good or bad using the second data and the normal convolutional neural network model;
    outputting a second prediction result on whether the second data is good or bad using the second data and the label-noise convolutional neural network model;
    comparing the first prediction result with the second prediction result to perform noise correction when there is a label difference;
    additionally training the pre-trained convolutional neural network model for third data created as results of the noise correction;
    second training the normal convolutional neural network model and the label-noise convolutional neural network model using the pre-trained convolutional neural network model that is additionally trained for the third data;
    outputting a third prediction result on whether the first data is good or bad using the first data and the normal convolutional neural network model;
    outputting a fourth prediction result on whether the first data is good or bad using the first data and the label-noise convolutional neural network model;
    comparing the third prediction result with the fourth prediction result to additionally perform the noise correction when there is the label difference; and
    additionally training the pre-trained convolutional neural network model for fourth data created as results of the additionally performed noise correction.

9. The method of claim 8, wherein the noise correction performed when there is a label difference comprises:
    determining whether there is a defect in the second data using an attention map created for the label difference for the first prediction result and the second prediction result, and
    correcting a label for the second data when it is determined that there is a defect, and
    wherein the additionally performing the noise correction comprises:

determining whether there is a defect in the first data using an attention map created for the label difference for the third prediction result and the fourth prediction result, and correcting a label for the first data when it is determined that there is a defect.

10. The method of claim 8, further comprising:

generating a visualization of bad data based on a clean data set created after the sampled clean data set has been corrected when there is no label difference, wherein the visualization of the bad data is based on performing clustering on the bad data according to attributes of defects detected from the bad data, and wherein the visualization of the bad data is further based on creating a defect classification model that classifies the defects of the bad data by the attributes of the defects based on the results of the clustering.

11. The method of claim 8, further comprising:

generating a visualization of bad data based on a clean data set created after the sampled clean data set has been corrected when there is no label difference, wherein the visualization of the bad data is based on performing clustering on the bad data according to attributes of defects detected from the bad data, and wherein the performing the clustering on the bad data comprises performing clustering on the bad data using a convolutional neural network auto-encoder.

12. A method for detecting defects in a semiconductor device, the method comprising:

pre-training a pre-trained convolutional neural network (CNN) model using a sampled clean data set extracted from a first data set;

training a normal convolutional neural network model and a label-noise convolutional neural network model using first data of the first data set and the pre-trained convolutional neural network model;

outputting a first prediction result on whether second data of a second data set is good or bad using the second data and the normal convolutional neural network model;

outputting a second prediction result on whether the second data is good or bad using the second data and the label-noise convolutional neural network model; and comparing the first prediction result with the second prediction result to generate a visualization of the bad data based on a clean data set created after a label has been corrected, when there is no label difference.

13. The method of claim 12, wherein visualization of the bad data visualizes the bad data using an attention map created for the clean data set.

14. The method of claim 12, wherein visualization of the bad data based on a clean data set is based on performing clustering on the bad data according to attributes of defects detected from the bad data.

15. The method of claim 14, wherein visualization of the bad data based on a clean data set is further based on creating a defect classification model that classifies the defects of the bad data by the attributes of the defects based on the results of the clustering.

16. The method of claim 14, wherein the performing the clustering on the bad data comprises performing clustering on the bad data using a convolutional neural network auto-encoder.

17. The method of claim 12, further comprising:

comparing the first prediction result with the second prediction result;

performing noise correction for the second data when there is a label difference;

adding third data created as results of the noise correction to the sampled clean data set; and additionally training the normal convolutional neural network model and the label-noise convolutional neural network model using the sampled clean data set.

18. The method of claim 17, wherein the performing the noise correction comprises:

determining whether there is a defect in the second data using an attention map created for the label difference, and correcting a label for the second data when it is determined that there is a defect.

19. The method of claim 17, after additionally training the normal convolutional neural network model and the label-noise convolutional neural network model using the sampled clean data set, further comprising:

outputting a third prediction result on whether the first data is good or bad using the first data and the normal convolutional neural network mode; and outputting a fourth prediction result on whether the first data is good or bad using the first data and the label-noise convolutional neural network model.

20. The method of claim 19, further comprising:

comparing the third prediction result with the fourth prediction result to additionally perform the noise correction when there is the label difference; and adding fourth data created as results of the additionally performed noise correction to the sampled clean data set.

* * * * *